(12) United States Patent
Bawell et al.

(10) Patent No.: US 6,806,789 B2
(45) Date of Patent: Oct. 19, 2004

(54) QUADRATURE HYBRID AND IMPROVED VECTOR MODULATOR IN A CHIP SCALE PACKAGE USING SAME

(75) Inventors: Shawn Peter Bawell, Waltham, MA (US); Simon Donald Gay, Cambridge, MA (US); Christopher Dirk Weigand, Woburn, MA (US)

(73) Assignee: M/A-Com Corporation, Lowell, MA (US)

( * ) Notice: Subject to any disclaimer, the term of this patent is extended or adjusted under 35 U.S.C. 154(b) by 0 days.

(21) Appl. No.: 10/055,278

(22) Filed: Jan. 22, 2002

(65) Prior Publication Data

US 2003/0137363 A1 Jul. 24, 2003

(51) Int. Cl.$^7$ .................................................. H01P 5/18
(52) U.S. Cl. .................................... 333/117; 333/26
(58) Field of Search ............................ 333/25, 115, 116, 333/117, 118, 26

(56) References Cited

U.S. PATENT DOCUMENTS

| | | | | |
|---|---|---|---|---|
| 3,723,914 A | | 3/1973 | Cappucci | 333/11 |
| 3,988,705 A | * | 10/1976 | Drapac | 333/109 |
| 3,999,150 A | * | 12/1976 | Caragliano et al. | 333/116 |
| 4,511,813 A | * | 4/1985 | Pan | 327/431 |
| 4,914,407 A | * | 4/1990 | Itoh | 333/161 |
| 5,214,796 A | * | 5/1993 | Gorrie et al. | 455/326 |
| 5,463,355 A | * | 10/1995 | Halloran | 332/103 |
| 5,748,056 A | | 5/1998 | Bahl | 333/112 |
| 5,781,071 A | * | 7/1998 | Kusunoki | 330/269 |
| 5,929,729 A | * | 7/1999 | Swarup | 333/246 |
| 6,143,981 A | | 11/2000 | Glenn | 174/52.4 |
| 6,396,362 B1 | * | 5/2002 | Mourant et al. | 333/25 |

FOREIGN PATENT DOCUMENTS

DE    1 297 779 A    11/1972    ............ H03H/7/00

OTHER PUBLICATIONS

Boylestad, Introductory Circuit Analysis, Merrill 4$^{th}$ Edition, pp. 227–230.*
"Vector Modulator Enhances Feedforward Cancellation", Silverman, Lawrence and Del Plato, Chris, Microwaves & RF, Mar. 1998.
International Search Report, International application No. PCT/US03/01481, International filing dated Jan. 16, 2003, Applicant's or agent's file reference 17797 PCT.

* cited by examiner

*Primary Examiner*—Robert Pascal
*Assistant Examiner*—Dean Takaoka

(57) ABSTRACT

In accordance with the present invention, a quadrature hybrid circuit is provided comprising a first spiral inductor and a second spiral inductor separated by an insulating layer to provide all necessary capacitances intrinsically. Further, a vector modulator circuit is provided that incorporates a plurality of quadrature hybrid circuits on a MMIC contained within a chip scale package.

18 Claims, 6 Drawing Sheets

QUADRATURE HYBRID AND IMPROVED VECTOR MODULATOR IN A CHIP SCALE PACKAGE USING SAME

FIELD OF THE INVENTION

The present invention relates to quadrature hybrid circuits, specifically a novel quadrature hybrid, and vector modulators, in general, and more specifically, a vector modulator contained in a small Chip Scale Package (CSP) using the novel quadrature hybrid circuit.

BACKGROUND OF THE INVENTION

A quadrature hybrid is a type of circuit commonly used to split and combine signals. Quadrature hybrids are used extensively in power amplifiers and in other applications requiring noise reduction and signal clarity. They are also commonly used as couplers in applications requiring signals to be split or shared, such as sampling applications, testing applications and detector applications.

The quadrature hybrid is an effective tool for creating noise reduction circuits because it can be used to achieve both power division and phase shifting. One popular technique for eliminating unwanted noise signals, such as intermodulation distortion, is to divide the signal in half to form two separate signals that differ in by phase 180 degrees, and then recombine the two signals. This causes the two signals to cancel each other upon recombination; thus, eliminating the unwanted noise signal.

Prior to the development of quadrature hybrids, this process was accomplished by using power divider circuits to split signals, and the creating a phase shift by using transmission lines of different lengths calculated to result in the desired phase shift. However, creating a phase shift using transmission lines requires an extremely large section of valuable integrated circuit area, and thus is not practical for many applications.

In response to the need for a better means to divide and shift signals, the quadrature hybrid circuit was developed. The symbol used to represent a quadrature hybrid in a circuit diagram is shown in FIG. 1. The symbol as shown in FIG. 1 illustrates the function of the quadrature hybrid. An input is applied to the RF IN port 101. The input signal is divided between two outputs (102a and 102b). The two outputs are of equal amplitude, but vary in phase by 90 degrees. The remaining output of the quadrature hybrid 103 is run through a 50 ohm terminating resistor to ground. This port provides the required isolation to the quadrature hybrid. The actual circuit structure of a quadrature hybrid typically comprises at least a pair of inductors and a pair of capacitors. Various quadrature hybrid circuit structures are well known in the prior art.

Quadrature hybrids in accordance with the prior art have been constructed using discrete components. A pair of discrete inductors and a series of discrete capacitor are mounted on a printed circuit board to form the quadrature hybrid. This method is extremely space consuming and not practical for many applications. It also requires a large number of components and a lengthy assembly time.

In an effort to reduce the size and cost of the quadrature hybrid, efforts have been made to incorporate the elements into an integrated circuit. However, these efforts have met with only limited success. The inductors required can be incorporated into an integrated circuit; however, a additional capacitors are necessary for the quadrature hybrid to function properly. Adding discrete capacitors increases the space necessary to form the quadrature hybrid. The capacitors could be incorporated into the integrated circuit by thin film deposition techniques. However, this would substantially increase the necessary chip area for the hybrid circuit as capacitors require large areas of integrated circuit, typically more than an inductor.

One circuit that commonly employs quadrature hybrids for noise cancellation in power amplifiers is a vector modulator. Vector modulator circuits use a series of quadrature hybrids to provide a means to vary the phase and amplitude of RF signals. They are commonly used in power amplifiers to improve signal purity and provide digital modulation.

Power amplifiers use feed forward loops to improve signal purity. Intermodulation distortion of signals can occur from the mixing of multiple RF signals. These unwanted distortion signals are known as intermodulation products. To cancel these unwanted intermodulation products, a signal that is of equal amplitude and 180 degrees out of phase therewith is created and combined with each intermodulation product.

Until recently, this was accomplished using variable attenuators to control amplitude in series with variable phase shifters to control signal phase. This method, however, was a poor solution in high-volume production environments because of the numerous components and complex circuitry required. In addition, variable phase shifters contain an inherent phase change limitation. While it is possible to achieve a full 360 degree range of phase shifting using variable phase shifters, random access to specific phase values is not possible. This means that, to reach a specific phase value, the variable phase shifter must cycle sequentially through a range of values to settle on the desired phase shift. This causes the transient response time associated with this technique to be relatively long. This can cause a dramatic degradation in the feed forward amplification performance.

To overcome these concerns, vector modulators were developed. Vector modulators are used to vary both the phase and amplitude of RF signals. A vector modulator uses a series of quadrature hybrids to achieve phase and amplitude adjustment. FIG. 2 illustrates a vector modulator comprising an input quadrature hybrid 201 that contains two isolated outputs 202a, 202b. Each output feeds a separate voltage variable attenuator. Each voltage variable attenuator is comprised of a quadrature hybrid (203a and 203b) that is terminated on the two output ports with matched diodes (205a, 205b, 205c, 205d) or field effect transistors (FETs). This forms an absorptive attenuator. The isolated port of each voltage variable attenuator is fed to another quadrature hybrid circuit 207 acting as a power combiner. The output signal from the power combiner 207 is the RF input signal with a new phase and amplitude.

Vector modulators are incorporated into feed forward amplifiers to eliminate intermodulation distortion without the problems associated with the variable attenuators and variable phase shifters previously used.

While the use of vector modulators is a significant improvement over the circuits comprising variable attenuators in series with variable phase shifters, they still have several limitations. Vector modulators in accordance with the prior art are not suitable for high volume production techniques because they are comprised of several distinct elements as described above. A substantial amount of hand assembly is required to build the vector modulator, causing the devices to be costly. Because of the elements comprising the quadrature hybrids as discussed above, vector modulators are not capable of easy integration into an integrated circuit.

In addition, prior art vector modulators are relatively large devices as a result of the large size required by the hybrids contained therein. The minimum x and y dimensions of a typical integrated circuit vector modulator used in the prior art are approximately 25 mm×31 mm, making the vector modulator an area intensive component of the feed forward amplifier.

It is desired to develop a device that could perform the required vector modulation (phase shift and amplitude attenuation) but that is smaller and conducive to incorporation into an integrated circuit, and thus more suitable to high volume production techniques. This would enable reductions in cost and the amount of real estate required on the circuit board while preserving the performance advantages of the vector modulator.

SUMMARY OF THE INVENTION

The present invention provides an improved quadrature hybrid and an improved vector modulator incorporating the improved quadrature hybrid. The quadrature hybrid in accordance with the present invention removes the distinct capacitors that were necessary in the prior art and instead modifies the physical layout of the inductors of the quadrature hybrid to intrinsically provide the capacitance for the quadrature hybrid. By removing the capacitors, the quadrature hybrid in accordance with the present invention is suitable to fabrication into a small integrated circuit and capable of being used in chip scale applications.

The quadrature hybrid in accordance with the present invention provides the signal coupling and phase shifting that was accomplished in the prior art; however, the quadrature hybrid in accordance with the present invention does not require separate inductors and capacitors to achieve the desired results.

The quadrature hybrid in accordance with the present invention comprises two spiral inductors formed on an integrated circuit. A first spiral inductor and a second spiral inductor are formed on separate substrate layers within the intergrated circuit. The first and second inductor are parasitically coupled across the dielectric to allow an RF signal that enters the quadrature hybrid via an RF input to be divided between two outputs.

The spiral inductors are located such that the first spiral inductor and the second spiral inductor are formed on separate metal layers separated by an insulating layer. As a result, the two inductors in combination with the insulating layer act as two plates of a capacitor separated by a dielectric layer. By designing the spiral inductors to achieve the capacitance required for the quadrature hybrid, the need for adding additional capacitors is eliminated. The size and separation of the spiral inductors is controlled to allow the capacitance created to equal the capacitance required for the quadrature hybrid to function as desired.

An additional facet of the present invention provides an improved vector modulator that incorporates a series of quadrature hybrids in accordance with the present invention fabricated into an Monolithic Microwave Integrated Circuit (MMIC). The vector modulator in accordance with the present invention uses an MMIC chip in combination with a series of diodes to perform the vector modulation. All of the components are combined into a single, small chip scale package.

A vector modulator in accordance with the present invention can be packaged into a small chip scale package approximately 4 millimeters by 6 millimeters in size.

The chip scale package of the vector modulator in accordance with the present invention provides for superior electrical performance as a result of its unique configuration. By placing the quadrature hybrids of the vector modulator in a chip scale package with a paddle that provides an RF ground, the path lengths are reduced. In turn, this reduces the amount of inductance generated, thus improving the electrical performance of the vector modulator.

DETAILED DESCRIPTION OF THE INVENTION

A quadrature hybrid in accordance with the present invention comprises a first spiral inductor and a second spiral inductor combined on an integrated circuit with a dielectric layer disposed between the two spiral inductors. The capacitances are provided by configuring the physical layout of the inductors and dielectric layer to intrinsically provide the desired capacitances; thus eliminating the need for separate capacitors to be built.

Figure 1:
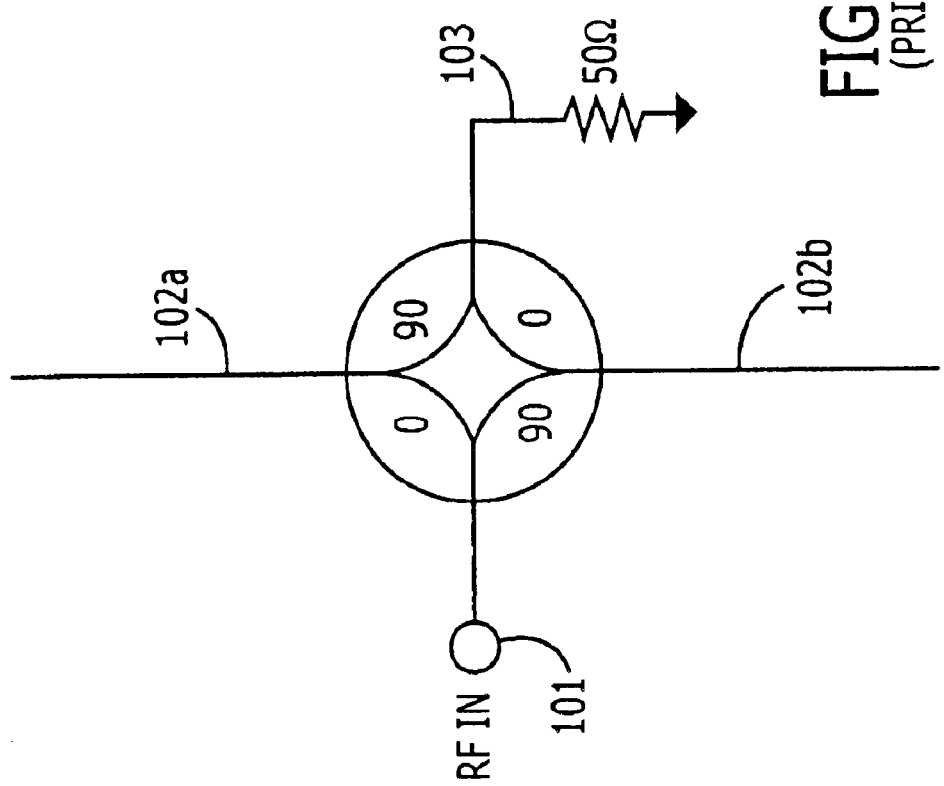
FIG. 1 is the symbol used in the prior art to represent a quadrature hybrid in a block diagram of a circuit.
Figure 2:
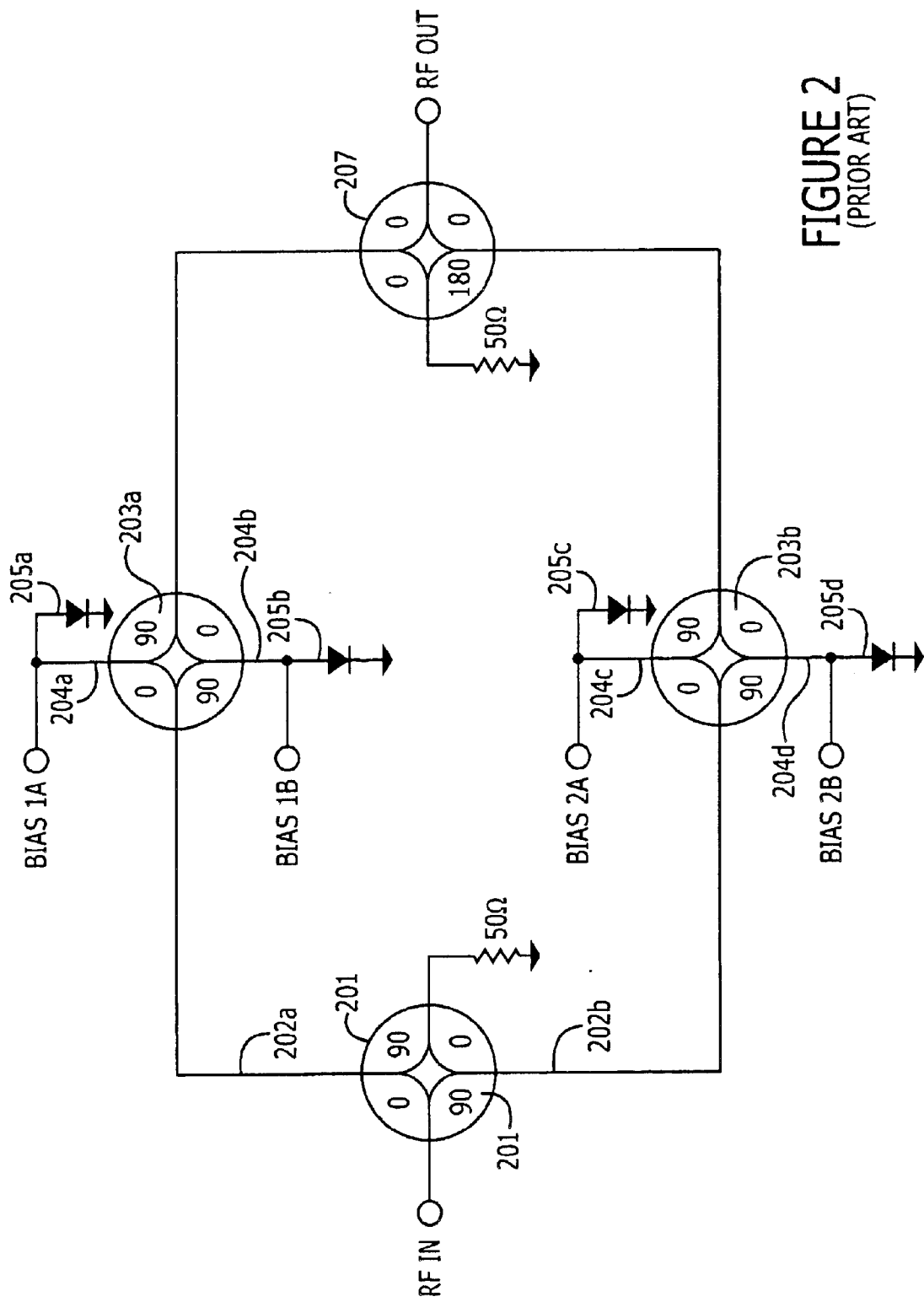
FIG. 2 is a block diagram of a vector modulator in the prior art.
Figure 3:
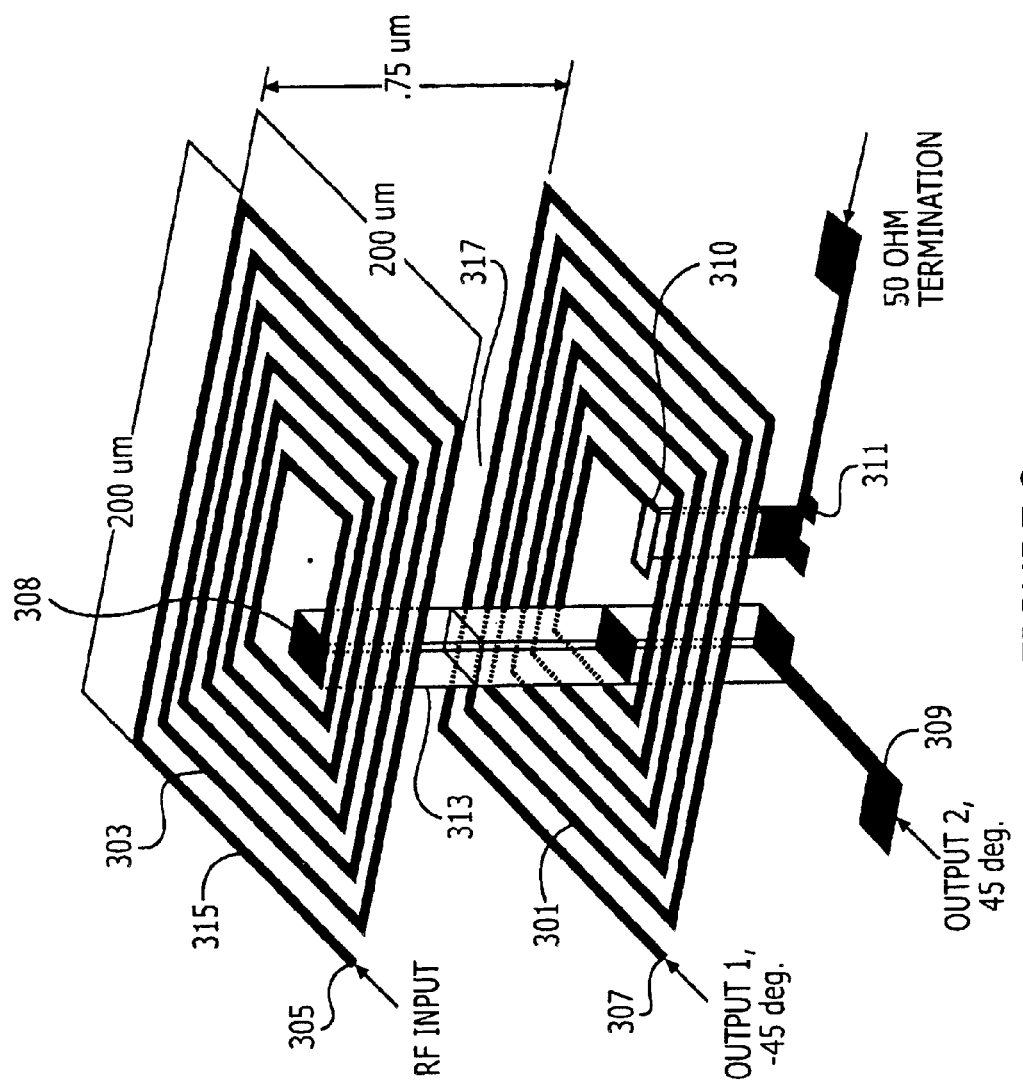
FIG. 3 is a circuit diagram of a quadrature hybrid in accordance with the present invention.
Figure 4:
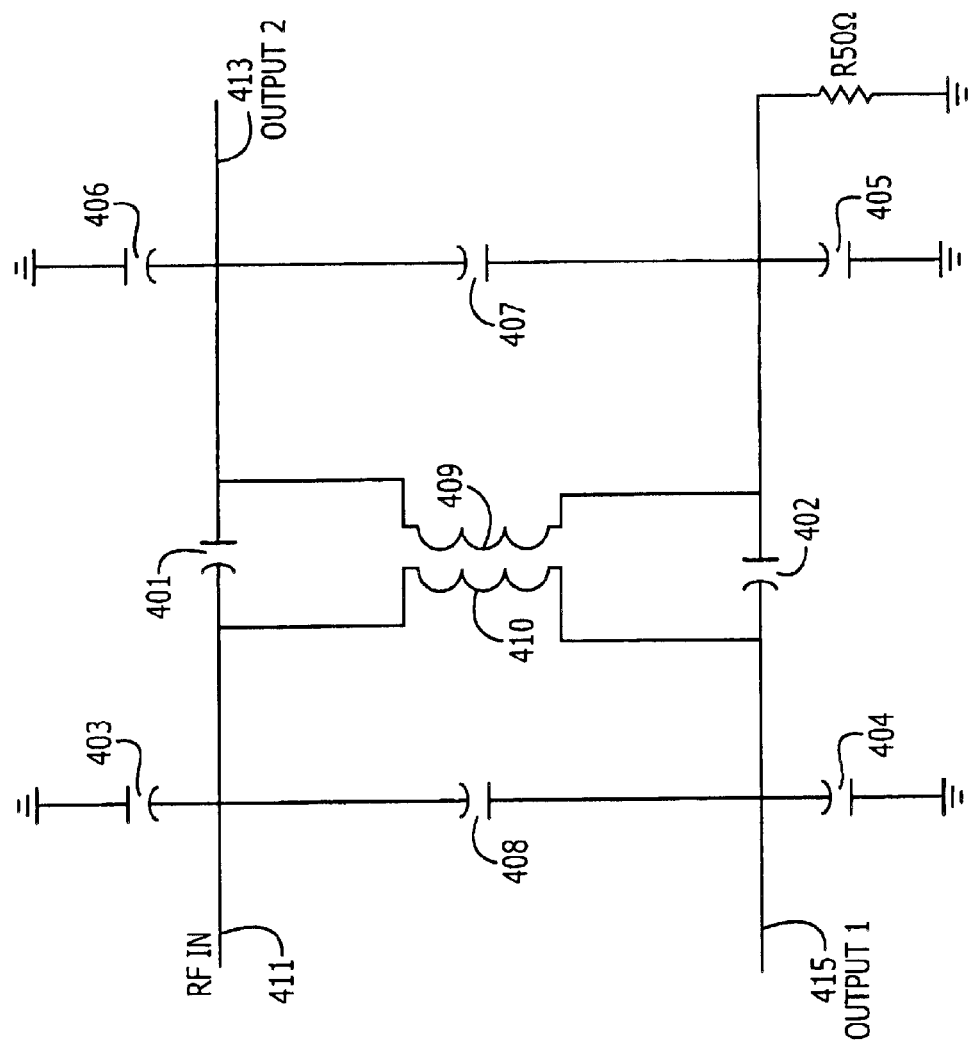
FIG. 4 is a drawing illustrating the structure and relationship of the components of the quadrature hybrid in accordance with the present invention.

FIG. 3 is an exploded perspective diagram of a quadrature hybrid circuit in accordance with one embodiment of the present invention and FIG. 4 is the equivalent circuit diagram thereof. Referring first to the circuit diagram of FIG. 4, the circuit comprises a pair of parallel inductors 409, 410 with capacitors 401, 402 coupled between the terminals of the inductors as shown. The input is applied at node 411. A portion of the signal applied at the input terminal 411 is transferred through capacitor 401 (the value of which is selected relative to the frequency band of the input signal to freely pass the input signal) to output node 413 with an approximate phase change of 45 degrees, and diminished amplitude. Another portion of the input signal appears at output terminal 415 after passing through the inductors, which provide an output phase of −45 degrees. The phase difference between the two outputs is 90 degrees. The remaining capacitors represent parasitic capacitances that typically are inherent in practical implementations of such circuits. Thus, capacitors 403, 404, 405, 406, 407 and 408 have much smaller values than capacitors 401 and 402. Nevertheless, capacitors 403, 404, 405, 406, 407 and 408 are shown for sake of accuracy and completeness, but, in fact, are often undesirable.

Capacitors 401 and 402 are the dominant capacitors relative to all of the other capacitors shown in the circuit diagram. It is these capacitances that are intentionally designed into the circuit in order to cause the quadrature hybrid to function as desired in accordance with the present invention.

FIG. 3 illustrates the structure of the quadrature hybrid in accordance with the present invention. A first spiral inductor 301 is formed in a first metal layer of an integrated circuit. In the preferred embodiment, a Monolithic Microwave Integrated Circuit (MMIC) is used; however, it is understood that the present invention could be manufactured using various types of integrated circuits. An insulating layer 317, shown as air or space in FIG. 3, is deposited on top of the first spiral inductor 301 and a second inductor 303 is deposited on top of insulating layer 317. In an actual, practical implementation of the present invention, the insulating layer would likely be a dielectric material. However, in order not to obscure the other circuit elements, insulating layer 317 is merely shown as space in FIG. 3. The insulating layer serves two purposes. First, it provides the separation required between the two spiral inductors 301, 303 to allow for the proper level of parasitic coupling. Secondly, it acts as the dielectric necessary to allow the two spirals of the inductors to function as a capacitor, thus eliminating the need for separate capacitors.

The second spiral inductor 303 is formed on a metal layer disposed on top of the insulating layer 317. In the preferred embodiment, the second spiral inductor 303 is an exact copy of the first spiral inductor 301, and is positioned directly above the first spiral. An RF signal is applied to the RF input 305 of the top spiral inductor 303. The signal is divided between the two spiral inductors as a result of the parasitic coupling. The end 308 of the spiral trace of the top inductor 303 (the opposite end from the input) is connected to a via 313 that extends downward through the insulating layer 317 to a second output 309. The end of the lower spiral inductor 301 located directly below the input end of the top spiral inductor 303 comprises a first output 307. The output achieved on the first output 307 and the second output 302 are equal in amplitude (each being one-half the input signal) and 90 degrees different in phase.

End 310 of the lower spiral inductor 301 opposite the first output 307 is terminated to ground via a 50 ohm termination 311. This provides for a drain to ground of any portion of the input signal that is reflected back from the lower spiral inductor 301 to prevent these reflections from traveling back to the input.

In accordance with the invention, the parallel spiral inductors 301, 303 are physically configured so as to intrinsically provide capacitances 401, 402 between the two inductors 409, 410. The capacitance between two parallel conductive plates is given by the following equation:

$$C = \frac{E_o E_r A}{D}$$

where:

$C$ = capacitance $E_o$ = permittivity constant of free space (equal to $8.854e^{-12}$)

$E_r$ = dielectric constant of the insulator between the two plates $A$ = area of each capacitive plate $D$ = distance between the capacitive plates, which is equal to the thickness of the insulating layer Using this equation, the layout parameters of the spiral inductors and/or insulating layer between them can be selected to provide effective capacitances 401, 402 of values equal to the desired values. In the equation above, C is the variable that we wish to set to a known value. $E_0$ is a constant. Accordingly, one can adjust any or all of (1) the thickness of the dielectric layer, which is D in the equation, (2) the dielectric constant of the dielectric layer, which is $E_r$ in the equation, (3) the width of the conductive traces of the spiral inductors, and (4) the length of the conductive traces of the spiral inductors, wherein the width and length of the traces collectively dictate variable A in the equation. The thickness, D, of the dielectric layer and its dielectric constant, $E_r$, may not be practically adjustable in many situations because of requirements or preferences in the fabrication process of the circuit. In such cases, the designer would work with one or both of the width and length of the traces of the inductors. In a preferred embodiment, the insulating layer is comprised of Silicon Nitride, which has a dielectric constant of 3.9. In the preferred embodiment, this layer is 0.75 microns thick. This thickness is defined by the fabrication process used to form the layer.

Given that $E_o$, $E_r$, and D are known quantities, the area, A, needs to be controlled in order to achieve the desired amount of capacitance C. The total area A is essentially the total length of the trace times its width.

In the preferred embodiment, the width of the traces used to form the spiral inductors is approximately 0.6 microns. This width was selected because it was the smallest practical width achievable with the particular fabrication process selected and it was believed that selecting the smallest possible width would result in the smallest overall die area for the circuit. Accordingly, the length of the traces was adjusted to arrive at an area A that yielded the needed capacitance for the quadrature hybrid to function properly.

However, adjusting the length of the traces of the spiral inductors to yield the desired capacitances can also affect the inductance values of the spiral inductors. The inductance value also is affected by the spacing of the various legs of the trace relative to each other. Accordingly, the spacing between the various legs of the spiral trace given the area of the trace can be adjusted to yield the desired inductance value. By use of the appropriate equation and/or circuit simulation software, the spacing parameter can be determined to match the desired inductance with the desired capacitance. In the preferred embodiment, the spacing between the traces on each spiral inductor is equal to the width of the traces, with both being equal to 0.6 microns. The overall dimensions of the spiral inductors used to create the quadrature hybrid in accordance with the present invention is 200 $\mu$m×200 $\mu$m.

This small size could not have been achieved with the techniques for constructing quadrature hybrids known in the prior art. The quadrature hybrid in accordance with the present invention provides a quadrature hybrid that is suitable for integrated circuit fabrication, making it much more cost effective than quadrature hybrids of the prior art. Because it does not require separate capacitors and can be made to significantly small sizes, it is useful for applications that were previously unsuited to chip scale packages because of size. As a result, quadrature hybrids in accordance with the present invention allow for further advancements in creating vector modulators.

In the prior art, vector modulators were large devices that were unsuitable for fabrication on integrated circuits or chip scale packages. By using a series of quadrature hybrids in accordance with the present invention, an improved vector modulator in accordance with the present invention can be built that provides vector modulation having 360 degrees of phase shift range, and a minimum of 10 dB of attenuation. In a preferred embodiment, the vector modulator in accordance with the present invention operates in the UMTS frequency band (2040 MHz to 2240 MHz); however, it is understood that it can be used with other frequency bands.

Figure 5:
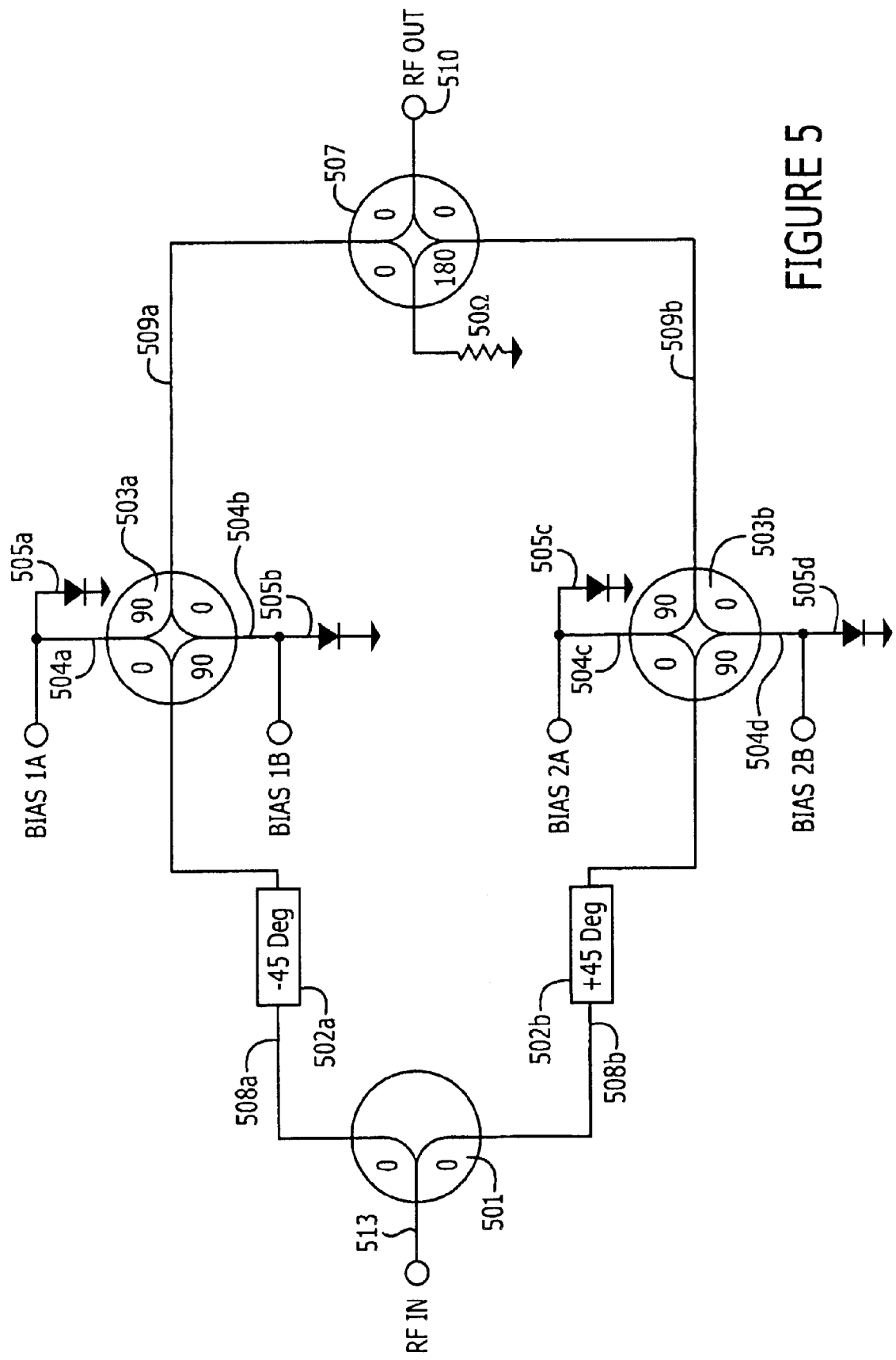
FIG. 5 is a block diagram of a vector modulator in accordance with the present invention.
Figure 6:
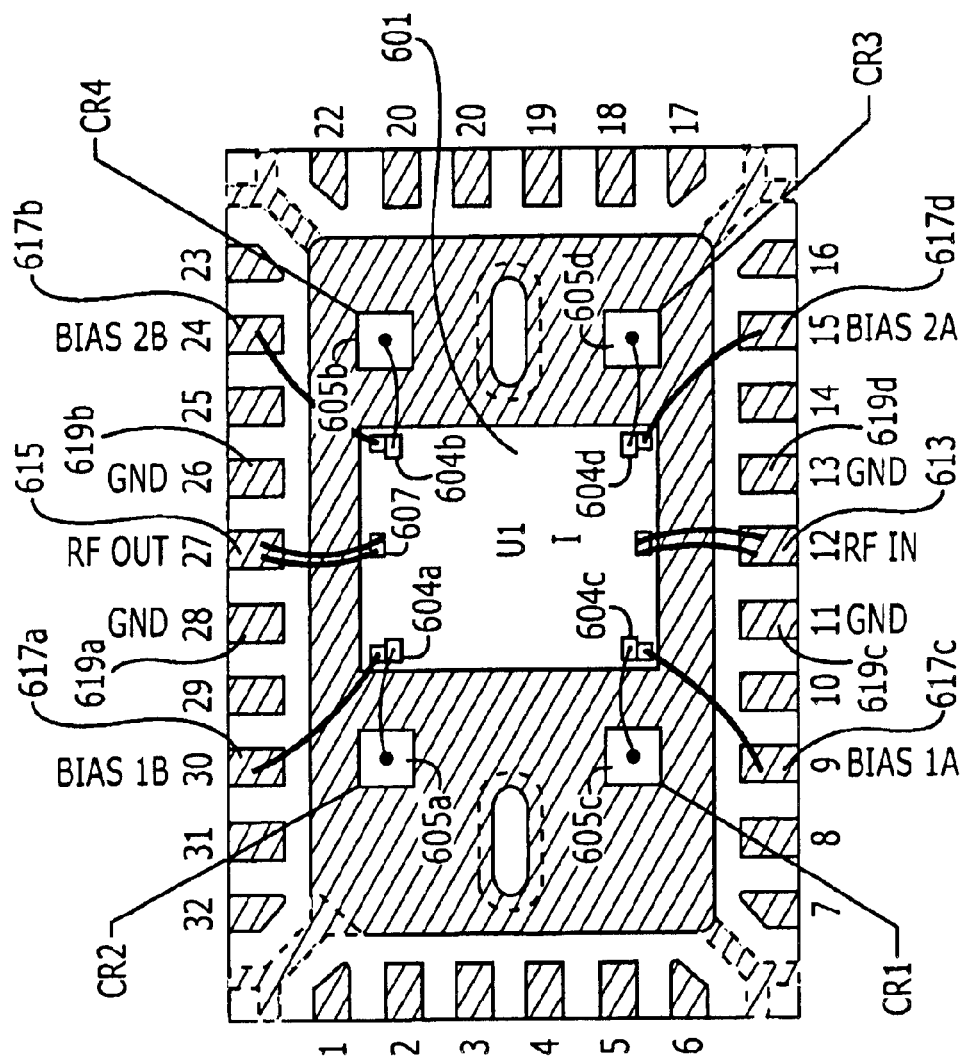
FIG. 6 is an assembly diagram of a chip scale package in accordance with the present invention.

The vector modulator in accordance with a preferred embodiment of the present invention is comprised of a MMIC 601 and four PIN diodes 605a, 605b, 605c, 605d as shown in FIG. 6. FIG. 5 is a block diagram of the inner working of the MMIC chip. The MMIC portion contains a three port ninety degree hybrid 501, 3 lead/lag filters (502a, 502b), 2 quadrature hybrids in accordance with the present invention (503a, 503b), and an in-phase power divider 507.

The MMIC is combined with four PIN diodes in a small chip scale package (6 mm×4 mm) to form the finished vector modulator. Each element shall be discussed in further detail below.

Monolithic Microwave Integrated Circuit

The MMIC is configured to include the hybrids and power divider components necessary to yield the vector desired performance of the vector modulator. In the preferred embodiment, the MMIC is formed from a 4 mil GaAs substrate, with internal ground vias. The thin nature of the MMIC and the internal vias enable the circuit elements to be located close to the ground plane. In this fashion, the amount of inductance which is created is minimized.

The RF signal enters the MMIC at input 513. RF IN 513 connects to an input power divider 501. The preferred embodiment of the present invention replaces the four port input power divider used in prior art vector modulators with a 3 port input power divider 501 used in conjunction with a pair of lead/lag filters 502a, 502b. The RF signal input is applied to the input of a 3-port power divider 501 and the outputs of the power divider (508a, 508b) are each applied to a lead/lag filter 502a, 502b. The phase of each filter section is +45 degrees and −45 degrees; thus, an output phase difference of 90 degrees is achieved. The internal composition of these elements is well known in the art; thus, no discussion of the composition of these elements is provided herein.

Within the MMIC, each of the outputs from the power divider (after passing through the lead/lag filters) is run to a quadrature hybrid (503a, 503b) constructed in accordance with the present invention, as described above. For each quadrature hybrid, there exists a pair of output ports (504a, 504b, 504c, 504d) that will be used to connect to the matched PIN diodes (505a, 505b, 505c, 505d). These outputs correspond to the output ports located on the surface of the MMIC and are shown in FIG. 6 at 604a, 604b, 604c, and 604d.

The remaining output (509a, 509b) of each quadrature hybrid is connected to a power combiner 507. The power combiner 507 combines the vectors from the voltage variable attenuators, which provides an output with controllable amplitude and phase. The resulting signal is output through the RF output node 510. A terminal for the RF output is defined on the MMIC and is shown on FIG. 6 at 607. This terminal is connected to a pin on the chip scale package designated as RF OUT 615.

PIN Diodes

The MMIC is used in conjunction with a series of terminating elements. Various devices including PIN diodes, Field Effect Transistors (FETs), or other transistors, such as PHEMT transistors or bipolar transistors, could be employed as terminating elements. In the preferred embodiment, the terminating elements are PIN diodes in order to maximize intermodulation performance. PIN Diodes 505a, 505b, 505c, and 505d are used to terminate the quadrature hybrids 503a, 503b. In the preferred embodiment of the present invention, the quadrature hybrids are contained within the MMIC. This was previously not possible because of the need to use separate capacitors. However, by using quadrature hybrids in accordance with the present invention as discussed above, the quadrature hybrids can be fabricated in a single, small MMIC integrated circuit. The diodes 505a, 505b, 505c, and 505d are connected to the MMIC outputs 604a, 604b, 604c, and 604d that correspond to the outputs of the quadrature hybrids contained within the MMIC.

Chip Scale Package

The MMIC and the PIN diodes are combined in a chip scale package in order to minimize the amount of PC board space required. In the preferred embodiment, a chip scale package 6 mm×4 mm in size is used. An assembly diagram of the chip scale package is shown in FIG. 6. There are two RF connections (RF IN 613 and RF OUT 615) and four bias connections (617a, 617b, 618a, 618b) located on the chip scale package. All of the remaining connections are coupled to ground. The ground connections are shown in FIG. 6 at 619a, 619b, 619c, 619d.

The bias pins 617a, 617b, 618a, 618b provide the current required to operate the PIN diodes. Pins 617a and 617c provide the current to the diodes associated with one of the two quadrature hybrids contained within the MMIC. Pins 617b and 617d provide the current to the diodes associated with the second of the two quadrature hybrids contained within the MMIC. By varying the current supplied to the diodes, the RF impedance of the diodes can be adjusted, which is necessary to perform the variable attenuation and phase shifting functions within the vector modulator.

In the preferred embodiment, the base or paddle of the chip scale package is metallic and provides an RF ground. This results in superior electrical performance over that of the vector modulators used in the prior art. In the prior art, the vector modulator circuit was grounded by using vias to pass through the substrate of the base (traditionally a ceramic or laminate material) to the grounding surface, or by wrapping the grounding surface around the substrate to make connection. Either method creates a greater level of inductance than is created in the preferred embodiment of the present invention. In the preferred embodiment, the base of the chip scale package is directly soldered to ground, thus providing a very low inductance path.

The preferred embodiment of the present invention provides a vector modulator in a small chip scale package. It is suitable for efficient high volume manufacturing because it combines the circuit elements necessary for vector modulation within an MMIC by using the improved quadrature hybrid in accordance with the present invention. This creates significant cost savings over prior vector modulators by reducing manufacturing and assembly time. The entire assembly is combined into a small chip scale package measuring 6 mm×4 mm, which is a significant reduction in size compared to prior art devices used to perform vector modulation. The small size of the vector modulator in accordance with the present invention results in a significant reduction in the amount of board space needed relative to prior art vector modulators, as they were approximately 25 mm×31 mm or larger in size. The physical size of the vector modulator in accordance with the present invention also results in lower inductance associated with the vector modulator, which in turn results in superior electrical performance.

It should be understood that the foregoing is illustrative and not limiting, and that obvious modifications may be made by those skilled in the art without departing from the spirit of the invention. Accordingly, the specification is intended to cover such alternatives, modifications, and equivalences as may be included within the spirit and scope of the invention as defined in the following claims.

What is claimed is:

1. A circuit functioning as a quadrature hybrid comprising;
   a first spiral inductor and a second spiral inductor;
   a first output and a second output,
   an insulating layer disposed between said first spiral inductor and said second spiral inductor, wherein said first spiral inductor and said second spiral inductor and said insulating layer are positioned relative to each other to create an intrinsic capacitance, said intrinsic capacitance selected in relation to said first and second inductors to cause said second output to be approximately ninety degrees different in phase to said first output.

2. A circuit as set forth in claim 1, wherein said first spiral inductor and said second spiral inductor each further comprise a spiral trace having a trace length, a trace width, and a spacing between the lines of said trace relative to each other,
   wherein said trace length, said width, and said spacing are chosen to provide a predetermined capacitance.

3. A circuit as set forth in claim 1, wherein said first spiral inductor and said second spiral inductor are aligned.

4. A circuit as set forth in claim 1, further comprising:
   a third output terminated to ground via a 50 ohm termination.

5. A circuit as set forth in claim 1, wherein said first spiral inductor, said second spiral inductor, and said insulating layer are contained on a Monolithic Microwave Integrated Circuit.

6. A circuit as set forth in claim 1, wherein said insulating layer comprises Silicon Nitride.

7. A circuit as set forth in claim 1, wherein the overall length and width dimensions of said first spiral inductor and said second spiral inductor are each approximately 200 um×200 um.

8. A circuit as set forth in claim 1, wherein the surface area of said first spiral inductor and said second spiral inductor are controlled to result in a specific intrinsic capacitance, said surface area is determined according to the following parameters:

$$C = \frac{E_o E_r A}{D}$$

where:

$C$ = capacitance $E_o$ = permittivity constant of free space (equal to $8.854e^{-12}$)

$E_r$ = dielectric constant of the insulator between the two plates $A$ = area of each capacitive plate $D$ = distance between the capacitive plates, which is equal to the thickness of the insulating layer 9. A circuit as set forth in claim 8, wherein said first spiral inductor and said second spiral inductor each further comprise a spiral trace having a trace length, a trace width, and a spacing between the lines of said trace relative to each other,
   wherein said trace length, said width, and said spacing are chosen to provide a predetermined capacitance.

10. A circuit for performing vector modulation, said circuit encapsulated within a chip scale package, comprising:
    an MMIC, said MMIC comprising:
       an input quadrature hybrid;
       an output power combiner;
       a first quadrature hybrid and a second quadrature hybrid, wherein said first and said second hybrids each comprise:
          a first spiral inductor and a second spiral inductor;
          an insulating layer disposed between said first spiral inductor and said
          second spiral inductor, wherein said first spiral inductor and said
          second spiral inductor and said insulating layer are positioned relative
          to each other to create an intrinsic capacitance; and
       a plurality of terminating elements.

11. A circuit as set forth in claim 10, wherein the terminating elements are PIN diodes.

12. A circuit as set forth in claim 10, wherein the number of terminating elements used is equal to four.

13. A circuit as set forth in claim 10, wherein the chip scale package contains a plurality of bias pins to provide current to the diodes.

14. A circuit as set forth in claim 10, wherein the size of said chip scale package is approximately 4 mm×6 mm.

15. A circuit as set forth in claim 10, wherein the MMIC is comprises a layer of GaAs.

16. A circuit as set forth in claim 10, wherein the thickness of said GaAs layer is approximately equal to 0.004".

17. A circuit as set forth in claim 10, wherein the chip scale package further comprises:
    an input pin for accepting a first RF signal; and,
    an output pin for outputting a second RF signal, said second signal being the result of
    said first RF signal after the vector modulation process is performed.

18. A circuit as set forth in claim 10, wherein said input quadrature hybrid divider further comprises:
    a three port power divider;
    a first and a second lead/lag filter, said first filter having a leading phase shift of 45 degrees and said second filter having a lagging phase shift of 45 degrees.

* * * * *